United States Patent [19]
Baker et al.

[11] Patent Number: 5,555,914
[45] Date of Patent: Sep. 17, 1996

[54] CRYOGENIC HEAT PIPE

[75] Inventors: Anna L. Baker; Darryl F. Garrigus, both of Seattle, Wash.

[73] Assignee: The Boeing Company, Seattle, Wash.

[21] Appl. No.: 465,281

[22] Filed: Jun. 5, 1995

Related U.S. Application Data

[62] Division of Ser. No. 404,015, Mar. 13, 1995, which is a division of Ser. No. 124,419, Jul. 28, 1993, Pat. No. 5,441,682, which is a continuation of Ser. No. 527,600, May 23, 1990, abandoned, and a continuation-in-part of Ser. No. 381,498, Jul. 18, 1989, which is a continuation-in-part of Ser. No. 698,496, Feb. 5, 1985, Pat. No. 5,041,321, which is a continuation-in-part of Ser. No. 667,568, Nov. 2, 1984, abandoned.

[51] Int. Cl.[6] .................... F16L 9/18; F28D 15/02
[52] U.S. Cl. ............ 138/115; 138/140; 165/104.26; 165/133; 122/366
[58] Field of Search .................. 138/115, 140, 138/141, 177; 165/104.26, 133, 905; 122/366

[56] References Cited

U.S. PATENT DOCUMENTS

| | | | |
|---|---|---|---|
| 459,385 | 7/1891 | Libbey | 138/115 X |
| 2,440,245 | 4/1948 | Chevigny | 138/115 X |
| 3,935,060 | 1/1976 | Blome . | |
| 4,452,832 | 6/1984 | Wrenn, Jr. . | |
| 4,548,258 | 10/1985 | Nelson et al. | 165/133 X |
| 4,642,271 | 2/1987 | Rice . | |
| 4,743,340 | 5/1988 | Wrenn, Jr. . | |
| 4,765,396 | 8/1988 | Seidenberg | 165/104.26 |
| 4,770,930 | 9/1988 | Wrenn, Jr. . | |
| 4,818,448 | 4/1989 | Wrenn, Jr. . | |
| 4,828,774 | 5/1989 | Andersson et al. . | |
| 4,849,276 | 7/1989 | Bendig et al. . | |
| 4,883,116 | 11/1989 | Seidenberg et al. | 165/104.26 |
| 5,009,822 | 4/1991 | Sacks et al. . | |
| 5,041,321 | 8/1991 | Bendig | 428/102 |
| 5,076,352 | 12/1991 | Rosenfeld et al. | 165/104.26 |
| 5,198,282 | 3/1993 | Baker et al. . | |
| 5,303,768 | 4/1994 | Alario et al. | 165/104.26 |
| 5,376,598 | 12/1994 | Preedy et al. | 501/89 |
| 5,441,682 | 8/1995 | Baker et al. | 264/82 |

FOREIGN PATENT DOCUMENTS

| | | | |
|---|---|---|---|
| 750073 | 8/1933 | France | 138/115 |
| 485730 | 10/1953 | Italy | 138/115 |
| 71759 | 4/1928 | Sweden | 138/115 |

OTHER PUBLICATIONS

NASA Tech Brief (Nov. 1989), p. 52 "Ceramic Wick for Capillary–Pumped Heat Pipe", by Goddard Space Flight Center.
NASA Tech Brief (Sep. 89), p. 84, "Capillary Pumped Heat Transfer Loop", by Marshall Space Flight Center.
NASA Tech Brief (Sep. 1989), p. 94, "Two–Pipe Heat–Transfer Loop", by NASA Jet Propulsion Laboratory.

*Primary Examiner*—David Scherbel
*Assistant Examiner*—Patrick F. Brinson
*Attorney, Agent, or Firm*—John C. Hammar

[57] ABSTRACT

A ceramic composite is provided comprising ceramic fibers and microparticles bound together as a porous matrix with a ceramic binder. The ceramic composite is particularly useful for transporting cryogenic fluids.

1 Claim, 2 Drawing Sheets

CRYOGENIC HEAT PIPE

This application is a divisional application of U.S. patent application Ser. No. 08/404,015, filed Mar. 13, 1995, which is a divisional application of U.S. patent application Ser. No. 08/124,419, filed Jul. 28, 1993, now U.S. Pat. No. 5,441,682, which is a continuation of U.S. patent application Ser. No. 07/527,600, filed May 23, 1990, now abandoned, and a continuation-in-part of U.S. application Ser. No. 07/381,498, filed Jul. 18, 1989, which is a continuation-in-part of U.S. patent application Ser. No. 06/698,496, filed Feb. 5, 1985, now U.S. Pat. No. 5,041,321, which is a continuation-in-part of U.S. patent application Ser. No. 06/667,568, filed Nov. 2, 1984, now abandoned, all of which are incorporated by reference.

TECHNICAL FIELD

This invention relates generally to fibrous ceramic materials, methods of their manufacture and methods of use thereof.

BACKGROUND OF THE INVENTION

Our prior application referenced above describes fibrous ceramic insulation materials formed by dispersing a suspension of ceramic fibers over a form-defining surface, drying the fibers to form a mat, solidifying the mat by soaking it with a sol-gel ceramic precursor, and gelling and curing the sol-gel precursor. The present invention is directed to an improvement to achieve improved mechanical strength, a lower dielectric constant and more isotropic properties as compared to the fibrous ceramic of our prior application.

SUMMARY OF THE INVENTION

The present invention improves on the fibrous ceramic disclosed in our prior application by providing a novel ceramic material comprising ceramic fibers and glass microballoons (and/or diatoms), which is set after impregnation with a sol-gel. The glass microballoons are usually about 5–200 microns in diameter and are hollow. Solid particles may be utilized, however, they increase the density of the ceramic composite. Various glasses with different wall thicknesses (in the case of hollow spheres) can be used to obtain the desired mechanical strength. In place of, or in combination with microballoons, diatoms may be used. Diatoms are porous silica inner support structures of certain marine and fresh water algae, having typical size ranges of 5–50 microns.

We have found that the rigidized fiber mat made in accordance with our prior application consists of fibers which are randomly tangled, most of which are oriented in the x-y plane (the z-axis being aligned with the thickness of the mat). When bound with the sol-gel binder, the random three dimensional network provides a material with a porosity of about 90–95%. However, according to the present invention, the voids between the ceramic fibers are filled by microballoons and/or diatoms, thus further rigidizing the structure. The mechanical compressive strength is increased as the fibers are supported by the microballoons (and/or diatoms). The strength of the material approaches that of the microballoons. Isotropic structural properties (i.e., similar properties in the x-y, x-z and y-z planes) are also more closely approximated. For comparison, typical useful densities of the fibrous ceramic of our prior application are in the range of 15–23 lb/ft$^3$. The useful range of the novel ceramic composites of the present invention may be tailored to be as low as about 7 lb/ft$^3$. Lower densities, may be achieved by using lower density microballoons and/or diatoms to achieve an increased strength-to-weight ratio. Selected densities may be achieved for specific applications. The processing time for preparing the ceramic material is substantially reduced, usually by one-half, over the time for making an all fibrous structure without sacrificing strength. Furthermore, problems associated with handling ammonia (used to cure the sol-gel binder) are reduced. In certain applications, the ceramic according to the present invention has a lower dielectric constant than that of the fibrous ceramic of our prior application. For example, at microwave frequencies, ceramic composites according to our prior application have dielectric constants around 1.4, whereas composites of the present invention have dielectric constants around 1.2.

Another significant advantage of the improved ceramic according to the present invention is its ability to transport and hold fluids (i.e., wickability), especially cryogenic fluids, such as liquid nitrogen. While not intending to limit the invention to any particular theory, it is believed that the capillaries in the improved ceramic composite allow liquid transport over large distance regardless of the spatial orientation of the required delivery site.

The material of the invention has good thermal shock resistance which allows for repeated cycling of the cryogenic fluid through the material. It also provides its own thermal insulation for the cryogenic fluid.

The microparticle enhanced fibrous ceramic (hereinafter sometimes abbreviated as MEFC) material according to the present invention is thus made by forming a slurry comprising ceramic fibers and microparticles, preferably microballoons and/or diatoms, in a liquid; dispersing the slurry over a form-defining surface, removing the liquid to form a wet mat of fibers and microparticles; drying the mat; soaking the mat with a sol-gel ceramic precursor binder; and gelling and curing the binder and mat at a sufficient temperature and for a sufficient period of time to convert the sol-gel precursor to ceramic, thereby forming the microparticle enhanced fibrous ceramic.

The microparticles are preferably glass microballoons and/or diatoms which are hollow, but solid microparticles may also be used. Microballoons have a crush strength in the range of about 500 to 4500 psi and are commercially available. The sol-gel binder is preferably an alumina precursor, but other sol-gel binders such as sol-gel precursors for silica, mullite, yttria, zirconia, boroaluminasilica, or any other of the sol-gels known to those skilled in the art may be used. Additives such as single crystal whiskers (silicon carbide, silicon nitride, alumina, etc.) may be used to impart desirable properties to the MEFC, such as to increase compressive strength and modulus, mechanical strength, and bulk porosity, etc.

A particularly preferred application of the MEFC is for preparation of a cryogenically cooled surface. The MEFC may be coated for example, by sputtering, plasma deposition, or application of paint, with a metal or metal oxide superconducting composition, or a precursor thereof. A superconductive film may be utilized, for example, as an antenna or electromagnetic shielding.

If the MEFC is coated with glass on the surface and the glass is polished, the resulting composite can serve as an optical surface to support a mirror.

A particularly preferred method of use of the MEFC is for transporting a cryogenic refrigerant to and/or from a locus to be cooled whereby the refrigerant is transferred through the porous MEFC. Many other uses of the MEFC are also possible, including use as a Dewar stopper, use as a cryogenic work table or a sample holder for working in a cool environment (for preparing frozen sections for histology), or use as a bulkhead, firewall or heat pipe.

DETAILED DESCRIPTION OF THE INVENTION

Figure 1:
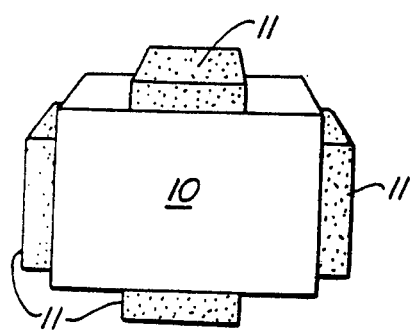
FIG. 1 is an illustration of an electronics package cooled by the MEFC material of the present invention attached to the exterior of the package.

One component of the MEFC according to the present invention is ceramic fiber. Ceramic fibers are known and many are commercially available. Preferably the ceramic fibers will be aluminosilicate fibers, but other fibers may be utilized including, but not limited to, fibers of silica, alumina, boroaluminasilica (commercially available under the trademark Ultrafiber® 440 from 3-M Company), zirconia, silicon nitride, and mixtures thereof. The fibers are available in various dimensions, usually from about 0.3 to 4 inches in length (the longest dimension of the fiber) and 1 to 10 microns in diameter. It should be realized that the dimensions of the fibers can be tailored to meet the physical characteristics which are desired in terms of mechanical strength, etc.

The glass microballoons are commercially available in many sizes and are generally hollow spheres made from various types of glass compositions with various wall thicknesses, usually in the size of about 5 to 200 microns in diameter. Solid spheres or diatoms may also be used in place of or in addition to the hollow microballoons. As in the case of the fibers, the size of the microballoons will in part determine the mechanical strength and physical characteristics of the MEFC. Preferably, the microballoons should be in a range of about 5 to 50 microns, which appears to be the preferred size for filling the voids which would otherwise exist between the fibers, thus increasing the strength of the MEFC. In some cases the MEFC may consist entirely of microballoons.

Typically, an aqueous slurry of the ceramic fibers and microballoons and/or diatoms is mixed to provide a substantially uniform dispersion. The concentration of the slurry is not particularly critical but, for convenience, the slurry will generally comprise up to 10 wt/% of the fibers, up to 10 wt/% of the microballoons and/or diatoms (based on the total weight of the slurry) with the remainder being water. The slurry may contain from 0–99 wt % of ceramic fibers and from 1–100 wt % microparticles, based on the combined weight of fibers and microparticles.

Diatoms may be used in the slurry. The extremely fine porosity of the diatoms may increase mechanical strength while also increasing the bulk porosity, which allows for higher cryogen incorporation per volume and smaller, more controlled porosity for gas/liquid interface control for membrane applications. The diatoms may comprise up to 100% by weight of the combined weight of the fiber and microparticles (microballoons and diatoms).

Typically, after the slurry has been thoroughly mixed, it is poured (i.e., vacuum-deposited) over a form-defining mold (usually porous enough to allow passage of the water therethrough but not the fibers or microballoons) which may be flat, irregular, curved, or virtually of any size or shape. The water is then removed typically by vacuum through the porous mold thereby forming a wet mat. The mat is then dried, usually at a temperature of up to about 200° F., to completely remove the water. Duration of the drying will, of course, depend upon the size and shape of the mat.

Once the mat has been dried, a sol-gel binder is introduced, preferably in incremental stages. The binder is preferably an alumina sol-gel glass that can be prepared by known techniques, such as those disclosed in our prior application. Incremental addition of the binder involves repeating the steps of impregnating the mat with the binder, gelling the binder and curing the mat and binder. Usually a light coating of binder is applied in the first stage followed by an air dried gellation to dimensionally stabilize the fiber mat. Thereafter, the steps of impregnating, gelling and curing are repeated one or more times until the total desired amount of binder has been added. Typically about 15 to 300 wt % of binder is used based on the initial weight of fibers and microballoons in the mat. The impregnating step may be accomplished by wicking, spraying, vacuum infiltrating, and the like.

After impregnation, the binder is converted to a rigid gel, usually by air drying or by subjecting the binder-impregnated mat to an atmosphere of ammonia gas. Since the ammonia-sol reaction is exothermic, the tendency of bubbles to form in the mat can be avoided by allowing the first batch of binder to gel in air.

After gelling the binder, the mat is cured, preferably by heating to about 200° F. for several hours (about four hours are preferred), then by slowly increasing the temperature to about 600° F. for a longer period of time (usually about five hours), and finally by reducing the temperature to ambient temperature.

In addition to the ceramic fibers and microballoons and/or diatoms, the slurry may also contain additives which can alter the physical characteristics of the MEFC. For example, by adding small ceramic whiskers (about 0.4 to 1 micron in diameter, 100:1 aspect ratio average) in small amounts (usually about 5 to 30% by combined weight of the fibers and microparticles), the compressive strength and modulus of the MEFC may be increased. Preferably, whiskers of silicon carbide of about 0.4 to 1 micron in diameter are useful for this purpose.

The MEFC may, if desired, be coated with a substrate. For example, the MEFC may be coated with a layer of mixed metal oxides by methods such as plasma spraying, sputtering, or by painting. Such a material coated with a mixed metal oxide superconductor layer may be useful, for example, as an antenna or as electromagnetic shielding enclosures for electronics.

The MEFC may also be coated with glass. For example, this may be accomplished by brushing a slurry of Pyrex® glass powder (preferably –325 mesh) and water on its surface, drying, preferably in air, in an oven at about 160° F., and firing the composite for several minutes, at about 2000° F. Other methods of applying glass to the surface include fusing the glass to the MEFC surface by torch, plasma spray, laser rastering, etc.

A high impact-resistant surface may be applied as a slurry to MEFC's surface by adding about 5 to 60 wt % Pyrex® glass powder to a matrix material comprising colloidal silica, mullite powder, single crystal whiskers (such as silicon carbide or silicon nitride) and trona. The coating may be dried and fired, usually for about ten minutes, as described above.

Sputtered metal or metal oxide on the glass surface, which is first polished to obtain the requisite smoothness, will form a mirror useful in light weight telescopes, antennas, reflectors, and the like.

The MEFC may also be used as a conduit for carrying a cryogenic cooling agent to a particular site. For example, there are many electronic and optical devices which require cryogenic cooling such as cold cameras (for astronomical applications), SQUIDS (superconducting quantum interference devices), bolometers, IR detectors, X-ray equipment, computers, circuit boards and high density packaged electronics. For example, the MEFC may be affixed to one surface of a substrate and the other surface of the substrate may accommodate the camera or electronic device to be cooled. Other applications of the MEFC include use as a cryogenically-fed, cold table with embedded delivery lines. A particular application of this cold table is a histology freezer for freezing or cooling tissue samples. Since it is a refractory material, the MEFC may be sterilized by high temperature methods without structural damage.

Another application is use as a porous explosion-proof stopper for a Dewar to relieve pressure caused by boil-off of the cryogen.

An all-ceramic heat pipe is also provided in which there is an MEFC inner wick with a central vapor channel, surrounded by a glass-coated outer ceramic matrix shell. This heat pipe can be used to cool electronics or aerospace vehicles. Working fluids include liquid nitrogen, ammonia, water and Freon®.

The MEFC may also be used as a light weight, heat dissipating component, such as use as a non-flammable interior, a building bulkhead (for example, in extraterrestrial habitat interiors) or engine firewall. The MEFC can replace conventional organic materials (which are toxic when they degrade) in reusable thermal protection systems in spacecraft, aircraft, high rise buildings, and automobiles. The MEFC is advantageous in that it does not exude toxic gases, has a lower density than most organic materials, and has low thermal conductivity (i.e., is a thermal insulator).

Referring to the figures, FIG. 1 shows a container of packaged electronics 10 which is cooled by attachment of a plurality of blocks 11 of MEFC material to the outer surfaces of the package 10. The cryogenic fluid (not shown) is in communication with the blocks 11 to cool the electronics (not shown) within the package 10.

Figure 2:
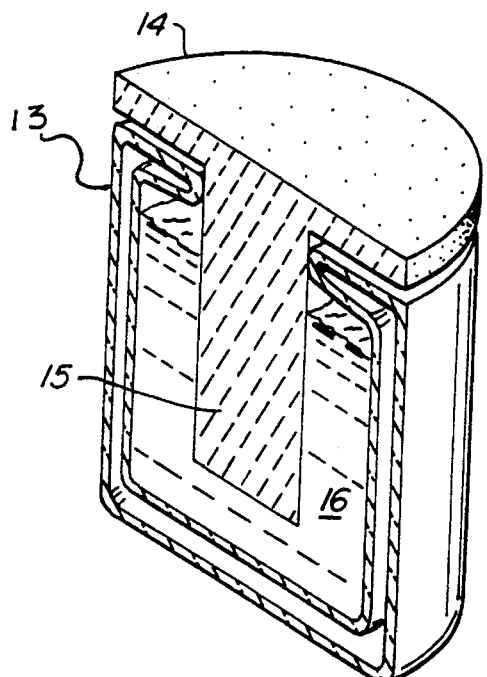
FIG. 2 is a schematic cross-section of a Dewar with a stopper of MEFC material.

FIG. 2 shows a cross-section of a Dewar comprising a shell 13 having an opening which is sealed by a stopper 14 made of MEFC material. The porosity of the MEFC allows for gas to escape from within the Dewar, thus relieving pressure. The stopper has an extension 15 which extends into the cryogenic fluid 16.

Figure 3:
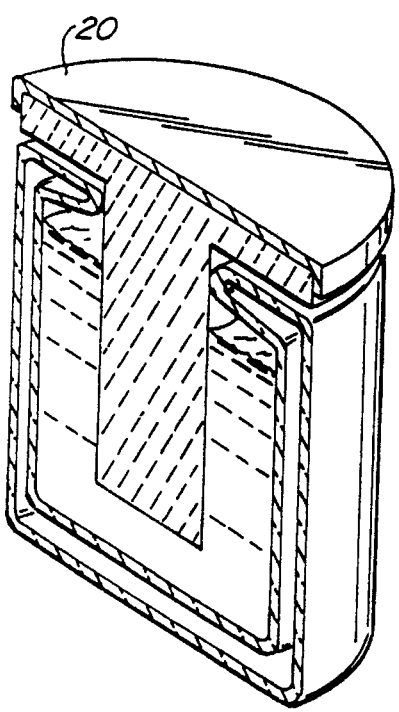
FIG. 3 is a cross-section of a Dewar with a stopper of MEFC material, with an optional working surface which serves as a portable freezer.

FIG. 3 shows a Dewar and MEFC stopper similar to FIG. 2. The stopper is adapted with a work surface 20 which is cooled by virtue of the wicking of the cryogen. The work surface 20 may be made of metal, glass, ceramics, or other suitble material. The surface 20 may be utilized as a portable histology freezer for freezing and examining samples.

Figure 4:
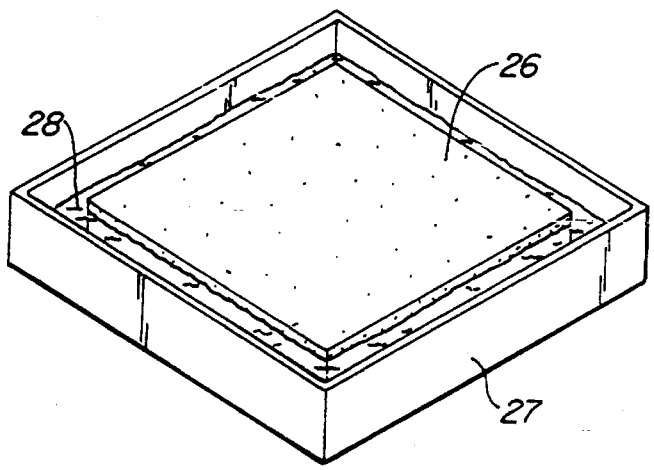
FIG. 4 is an illustration of a work surface cooled by MEFC material in a tray of cryogenic fluid.

Referring to FIG. 4, a cryogenically-cooled work surface is provided by inserting a slab of MEFC 26 into a tray 27 containing a cryogenic fluid 28.

Figure 5:
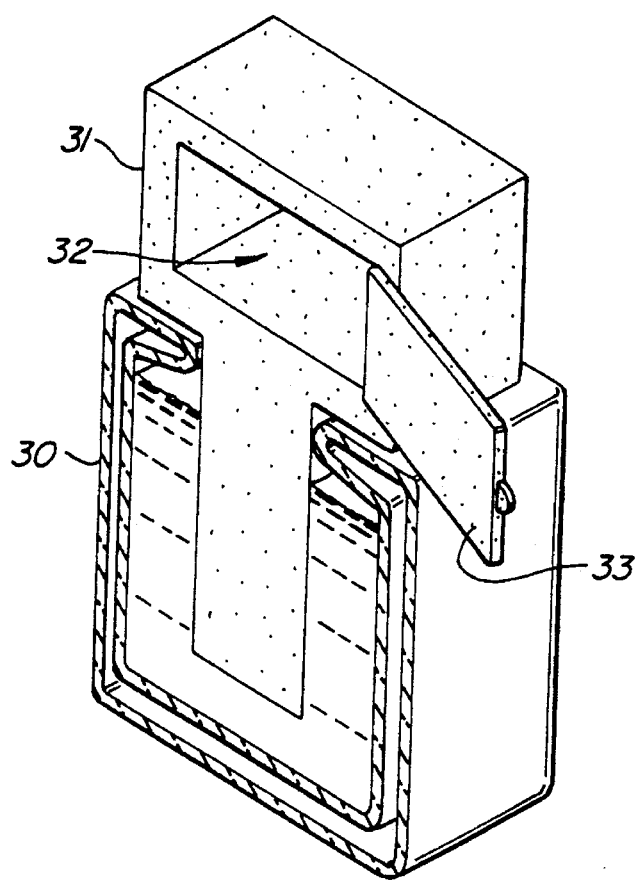
FIG. 5 is a schematic cross-section of a refrigeration unit made of MEFC material in communication with a cryogenic fluid.

Referring to FIG. 5, there is shown a Dewar with a specially adapted MEFC stopper 31 which serves as a low cost refrigeration unit. The MEFC stopper 31 includes a cavity 32 which can be enclosed with door 33. Objects to be refrigerated or frozen may be placed within the cavity 32.

Figure 6:
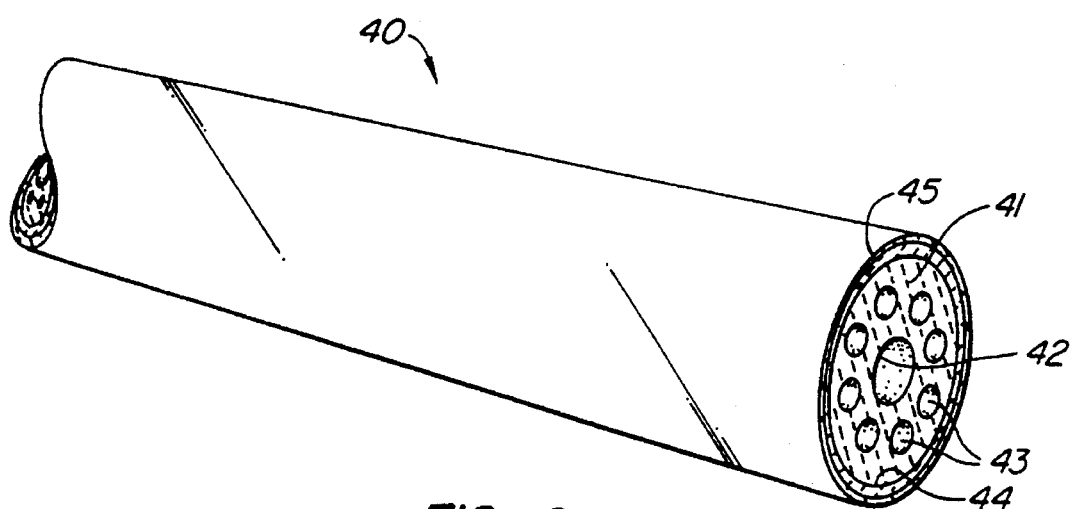
FIG. 6 is a section of a heat pipe comprising an inner wick of MEFC material.

Referring to FIG. 6, a heat pipe 40 is shown comprising an MEFC inner wick 41 with a central vapor channel 42 and a ring of arteries 43. The wick 41 is enclosed by a reinforced ceramic laminate 44 made, for example, of a ceramic disclosed in copending, commonly assigned U.S. application Ser. No. 07/212,397, filed Jun. 27, 1988, now U.S. Pat. No. 5,376,598 which is incorporated by reference herein. The laminate 44 is coated by Pyrex® or other shock-resistant glass coating 45 to make the heat pipe gas tight.

In all of the above configurations the surfaces of the MEFC which would otherwise be exposed to the atmosphere may be coated with a suitable coating, as glass, to contain the cryogen within the MEFC.

While preferred embodiments have been shown and described, those skilled in the art will recognize modifications, variations, or alternatives that can be made without departing from the invention. The examples are provided to illustrate the invention and are not meant to limit it. Therefore, the specification and claims should be interpreted broadly to protect the invention here described. The claims should be limited only as is necessary in light of the pertinent prior art.

What is claimed is:

1. A heat pipe comprising a core of porous ceramic composite, said core accommodating a central channel extending along the longitudinal axis of said pipe, and a plurality auxiliary channels radially displaced about said central channel, said auxiliary channels extending along the longitudinal axis of said pipe; a ceramic matrix laminate annularly surrounding said core; and a sealing coating at least annularly surrounding said laminate; wherein said porous ceramic composite comprising about 0–99 wt % ceramic fibers and about 1–100 wt % microparticles bound together as a porous matrix with a ceramic binder.

\* \* \* \* \*